United States Patent [19]

Finter

[11] Patent Number: 4,677,155
[45] Date of Patent: Jun. 30, 1987

[54] ANTHROQUINONYL PHOTOSENSITIVE POLYMERS

[75] Inventor: Jürgen Finter, Freiburg, Fed. Rep. of Germany

[73] Assignee: Ciba-Geigy Corporation, Ardsley, N.Y.

[21] Appl. No.: 837,851

[22] Filed: Mar. 6, 1986

Related U.S. Application Data

[63] Continuation of Ser. No. 445,404, Nov. 30, 1982, abandoned.

[30] Foreign Application Priority Data

Nov. 30, 1981 [CH] Switzerland ............... 7653/81

[51] Int. Cl.$^4$ ........................... C08F 230/04
[52] U.S. Cl. ................... 524/781; 524/785; 526/284; 430/270
[58] Field of Search ........ 526/284; 430/270; 524/781, 785

[56] References Cited

U.S. PATENT DOCUMENTS

| | | | |
|---|---|---|---|
| 3,575,925 | 4/1971 | Skoultchi | 430/270 |
| 3,591,661 | 7/1971 | Rogers, Jr. et al. | 526/284 |
| 3,953,408 | 4/1976 | Hosoi et al. | 526/320 |
| 4,093,793 | 6/1978 | Champrevis | 526/284 |
| 4,144,252 | 3/1979 | Wong et al. | 526/284 |
| 4,234,674 | 11/1980 | Woodbrey et al. | 430/270 |

FOREIGN PATENT DOCUMENTS

| | | | |
|---|---|---|---|
| 53-67419 | 6/1978 | Japan | 430/270 |
| 7805329 | 12/1977 | Netherlands | 430/270 |
| 887572 | 7/1981 | U.S.S.R. | 526/284 |

Primary Examiner—Joseph L. Schofer
Assistant Examiner—Peter F. Kulkosky
Attorney, Agent, or Firm—Luther A. R. Hall

[57] ABSTRACT

Novel photosensitive polymers having an intrinsic viscosity $[\eta]$ of not less than 0.10 dl/g, measured at 25° C. in N,N-dimethylformamide, and consisting of 1 to 40 mol % of recurring structural elements of the formula I

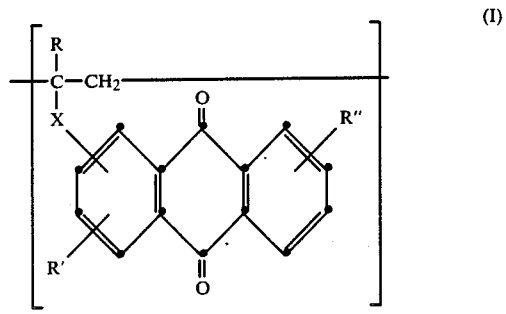

and 60 to 99 mol % of recurring structural elements of the formula II

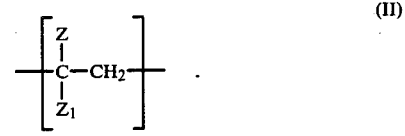

in which R, R', R", X, Z and $Z_1$ are as defined in patent claim 1, are described. The polymers according to the invention can be partially complexed with metal ions of a metal of group VIII or Ib of the periodic table. In not less than 20% of the structural elements of the formula II, $Z_1$ is —COO—$C_{2-12}$-alkylene-OH, —COO($CH_2CH_2O)_pH$, —COO[$CH_2CH(CH_3)O]_pH$, hydroxymethylphenyl, —CONH-$C_{1-4}$-alkylene-OH or —COO-$C_{1-4}$—alkylene-N(Q')(Q"), where p=2-4. The polymers according to the invention can be used, inter alia, for producing images, in particular for the construction of electrically conductive coatings or patterns.

12 Claims, No Drawings

ANTHROQUINONYL PHOTOSENSITIVE POLYMERS

This is a continuation of application Ser. No. 445,404, filed Nov. 30, 1982, now abandoned.

The invention relates to novel photosensitive polymers, a process for their preparation, novel anthraquinone derivatives which can be used in this process, and the use of the novel photosensitive polymers, in particular for producing images.

Electrically conductive coatings and patterns, in particular for printed circuits, can be prepared, inter alia, by producing, on non-conductive inorganic or organic substrates, zero-valent metal nuclei which are suitable for electroless metal deposition. In the so-called photoformation process, this can be effected by depositing metal salts, in particular salts of non-noble metals, such as copper formate, onto the substrate, where relevant in an acid medium and in the presence of halide ions, and then reducing the salts to zero-valent metal nuclei by irradiation, where relevant in the presence of chemical reducing agents. Photosensitive reducing agents, a second reducing agent and a surfactant are generally employed for the reduction of the metal salts. Suitable photosensitive reducing agents include, inter alia, anthraquinonedisulfonic acids and salts thereof, where relevant as a mixture with metal activators, for example tin salts. The substrates must in general be surface-etched or provided with an etchable adhesion promoter layer before deposition of the metal [intramolecular photoreductive method; cf. for example, U.S. Pat. Nos. 3,959,547 and 3,993,802].

In another process which has already been disclosed, a photosensitive layer containing titanium dioxide is produced on the non-conductive substrate, or titanium dioxide is incorporated into the substrate. The substrate or layer containing the titanium dioxide must then be surface-etched in order to make the $TiO_2$ particles available for further treatment. The surface-etched material is then treated with a solution of the desired metal salt and irradiated (photoelectron method). Finally, zero-valent metal nuclei can also be obtained by first depositing a photosensitive metal salt, for example tin-II hydroxide or iron oxalate, on the non-conductive substrate, producing a latent image or reducing metal ions by irradiation and then producing the zero-valent metal nuclei by reduction of a metal salt, in general a noble metal salt (photoelectrochemical method). The zero-valent metal nuclei thus obtained can then be metallised by electroless metal deposition in a manner which is known per se, and the conductive portions of the images can be further intensified, if necessary, by electrolytic deposition of metal.

Novel photosensitive polymers have now been found, with which images, especially electrically conductive coatings and patterns, can be produced in a substantially simpler and more economical manner and surface-etching of the substrate or the use of etchable adhesion promoter layers can be dispensed with. Images produced with the novel polymers also have an increased resolution.

The invention thus relates to novel polymers having an intrinsic viscosity $[\eta]$ of not less than 0.10 dl/g, measured at 25° C. in N,N-dimethylformamide, and consisting of 1 to 40 mol % of recurring structural elements of the formula I

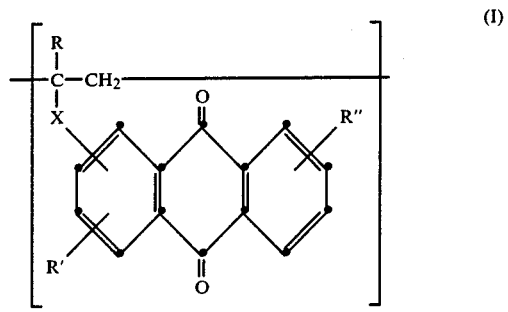

and 60 to 99 mol % of recurring structural elements of the formula II

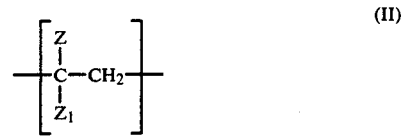

in which R is hydrogen, methyl or ethyl, R' and R" independently of one another are hydrogen, $C_1$–$C_4$-alkyl, halogen, nitro or methoxy, X is —COO—, —CO—O—$(CH_2)_n$—, —CO—O—$[(CH_2)_n$—O]$_r$—$CH_2$—, —CO—O—[-$(CH_2)_n$—O]$_r$—, —CO—O—$[CH_2CH(CH_3)O]_n$—, phenylene—$CH_2$—O—, —CO—O—$[(CH_2)_n$—O]$_r$—CO—, —CO—O—$[CH_2CH(CH_3)$—O]$_n$—CO—, —CO—NR—, phenylene—$CH_2O$—$[(CH_2)_n$—O]$_r$—$(CH_2)_m$—, phenylene—$CH_2O$—n$[(CH_2)_n$—O]$_r$—CO—, —COOCH$_2$CH(OH)CH$_2$OCO—, —COOCH$_2$CH(OH)CH$_2$O— or —CO—O$[CH_2CH(CH_3)O]_r$—$CH_2$—, m is zero or 1, n is an integer from 1 to 12, r is an integer from 1 to 4, preferably 1, Z is hydrogen, chlorine or methyl, $Z_1$ is hydrogen, chlorine, methyl, —CN, —COOH, —CONH$_2$, phenyl, methylphenyl, methoxyphenyl, cyclohexenyl, imidazolyl, pyrrolidonyl, —COO—alkyl having 1–12 C atoms in the alkyl moiety, —COOphenyl,

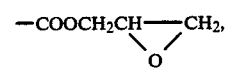

—COO—alkylene—OH having 2–12 C atoms in the alkylene moiety, —COO(CH$_2$CH$_2$O)$_p$H or —COO[CH$_2$CH(CH$_3$)O]$_p$H, where p is 2–4, —OCOalkyl having 1–4 C atoms in the alkyl moiety, —OCOphenyl, —COalkyl having 1–4 C atoms in the alkyl moiety, $C_{1-12}$-alkoxy, phenoxy, hydroxymethylphenyl, —CONH—$C_{1-4}$-alkylene—OH or —COO—$C_{1-4}$-alkylene—N(Q')(Q''), Q' is hydrogen or $C_{1-5}$-alkyl and Q'' is $C_{1-5}$-alkyl, and in which, in not less than 20% of the structural elements of the formula II, $Z_1$ is —COO—$C_{2-12}$-alkylene—OH, —COO(CH$_2$CH$_2$O)$_p$H, —COO[CH$_2$CH(CH$_3$)O]$_p$H, hydroxymethylphenyl, —CONH—$C_{1-4}$-alkylene—OH or —COO—$C_{1-4}$-alkylene—N—(Q')(Q''), and the structural elements of the formula II can be at least partly complexed with metal ions of a metal of group VIII or Ib of the periodic table, with the proviso, that, if X is —CO—O—CH$_2$—, $Z_1$ is —COOCH$_2$CH$_2$OH in not more than 80% of the structural elements of the formula II.

A halogen atom R' and/or R" is, in particular, a chlorine or bromine atom, and an alkyl group R' or R", an alkoxy group $Z_1$ and an alkyl or alkenyl group in the radicals $Z_1$ can be straight-chain or branched. Examples of suitable alkyl groups R' and R" are methyl, ethyl, n-propyl, isopropyl, n-butyl and sec.-butyl. An alkyl group R' and R" is preferably straight-chain and has 1 or 2 carbon atoms. R' and R" are particularly preferably each hydrogen. A —COOalkyl, —COO—alkylene—OH, —COO($CH_2CH_2O)_{\overline{p}}$H, —COO[$CH_2CH(CH_3)O]_{\overline{p}}$—H, —OCO—alkyl, —COalkyl, alkoxy, —CONH—$C_{1-4}$-alkylene—OH or —COO—alkylene—N(Q')(Q") radical $Z_1$ as defined is, for example, one of the following radicals: —COOmethyl, —COOethyl, —COO—n-propyl, —COOisopropyl, —COO—n-butyl, —COO—n-pentyl, —COO—n-hexyl, —COO—2-ethylhexyl, —COO—n-octyl, —COO—n-decyl or —COO—n-dodecyl; —COOCH$_2$CH$_2$OH, —COOCH$_2$CH(OH)CH$_3$, —COO(CH$_2$)$_3$—OH, —COOCH(CH$_3$)$_2$—OH, —COOCH$_2$CH(CH$_3$)$_2$—OH, —COO(CH$_2$)$_4$—OH, —COO(CH$_2$)$_6$—OH, —COO(CH$_2$)$_8$—OH, —COO(CH$_2$)$_{10}$—OH or —COO(CH$_2$)$_{12}$—OH; —OCOCH$_3$, —OCOC$_2$H$_5$, —OCO—n-propyl, —OCO—isopropyl or —OCO—n-butyl; —COCH$_3$, —COC$_2$H$_5$— —CO—n-propyl, —CO—isopropyl or —CO—n-butyl; methoxy, ethoxy, n-propoxy, isopropoxy, n-butoxy, n-hexyloxy, 2-ethylhexyloxy, n-octyloxy, n-decyloxy or n-dodecyloxy; —CONH—(CH$_2$)$_2$—OH, —CONH—(CH$_2$)$_3$—OH or —CONH—(CH$_2$)$_4$—OH; —COO(CH$_2$)$_2$N(CH$_3$)$_2$, —COO(CH$_2$)$_2$N(C$_2$H$_5$)$_2$, —COO(CH$_2$)$_3$N(CH$_3$)$_2$, —COO(CH$_2$)$_2$N(n-propyl)$_2$, —COO(CH$_2$)$_4$N(CH$_3$)$_2$, —COO(CH$_2$CH$_2$O)$_{\overline{2}}$H, —COO[CH$_2$CH(CH$_3$)O]$_{\overline{2}}$H, —COO(CH$_2$CH$_2$O)$_{\overline{3}}$H and —COO[CH$_2$CH(CH$_3$)O]$_{\overline{3}}$H.

X is preferably bonded to the anthraquinone radical in the 2-position, and is bonded to the group $$-\overset{|}{\underset{}{C(R)}}-$$

as follows: X=phenylene—CH$_2$—O—[(CH$_2$)$_n$—O]$_r$(CH$_2$)$_m$, phenylene—CH$_2$—O— or phenylene—CH$_2$—O—[(CH$_2$)$_n$—O]$_r$CO: via the phenylene group; other meanings of X: via the carbonyl group.

The polymers according to the invention preferably have an intrinsic viscosity of 0.30 to 0.50 dl/g, measured at 25° C. in N,N-dimethylformamide (DMF). The average molecular weight of the polymers is generally between 10,000 and 1,000,000, in particular 150,000 and 300,000, daltons. The average molecular weight of the polymers can be determined by methods which are known per se, for example by means of light scattering.

In the polymers complexed in the manner defined, the proportion of structural elements of the formula I is preferably between 1 and 15 mol %, in particular between 1 and 10 mol %. In the case of non-complexed polymers, the proportion of structural elements of the formula I is advantageously not more than 40, and in particular from 3 to 35, mol %. Preferred structural elements of the formula I are those in which X is bonded in the 2-position on the anthraquinone radical, R is hydrogen or, in particular, methyl, R' and R" are each hydrogen, X is —COO—, —COO—[CH$_2$CH(CH$_3$)—O]$_{\overline{n}}$ or —COO—[(CH$_2$)$_n$—O]$_{\overline{r}}$ where n=1-11, in particular 1-8, —COO—CH$_2$—, —COO—[(CH$_2$)$_n$—O]$_{\overline{r}}$CO— or —COO—[(CH$_2$)$_n$—O]$_r$—CH$_2$—, where n=2-8, or phenylene-CH$_2$O—, and r is preferably 1. X is particularly preferably —COO— or phenylene—CH$_2$—O—.

In 20 to 97.5%, and in particular 20 to 70%, of the structural elements of the formula II $Z_1$ is preferably —COO—C$_{2-12}$-alkylene—OH, hydroxymethylphenyl, —CONH—C$_{1-4}$-alkylene—OH, —COO—C$_{1-4}$-alkylene—N(Q')(Q"), —COO(CH$_2$CH$_2$O)$_{\overline{p}}$H or —COO[CH$_2$CH(CH$_3$)O]$_{\overline{p}}$H.

Preferred structural elements of the formula II are those in which Z is hydrogen, chlorine or methyl and $Z_1$ is hydrogen, chlorine, CN, methyl, phenyl, methylphenyl, methoxyphenyl, —COO—C$_{1-10}$-alkyl, —COOphenyl,

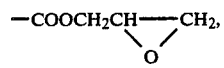

—COO—C$_{2-12}$-alkylene—OH, —CO—alkyl having 1-4, and in particular one or two, C atoms, alkoxy having 1-8, and in particular 1-4, C atoms, phenoxy, hydroxymethylphenyl, —CONH(CH$_2$)$_{\overline{2}}$OH or —COO—C$_{1-4}$-alkylene—N(C$_{1-4}$-alkyl)$_2$, the proportion of —COO—C$_{2-12}$-alkylene—OH, hydroxymethylphenyl, —CONH(CH$_2$)$_2$-OH or —COO—C$_{1-4}$-alkylene—N(C$_{1-4}$-alkyl)$_2$ groups $Z_1$ being 20 to 70%.

Structural elements of the formula II in which Z is hydrogen or methyl and $Z_1$ is methyl, phenyl, methylphenyl, —COO—C$_{1-10}$-alkyl, —COO—C$_{2-12}$-alkylene—OH, hydroxymethylphenyl or —COO—C$_{1-4}$-alkylene—N(CH$_3$)$_2$, the proportion of —COO—C$_{2-12}$-alkylene—OH, hydroxymethylphenyl or —COO—C$_{1-4}$-alkylene—N(C$_3$)$_2$ groups being 20 to 70%, are particularly preferred.

Salts of the metals of the type defined with organic or inorganic acids or mixtures thereof are suitable for any complexing of the polymers according to the invention, such as carboxylates, for example formates, acetates, stearates, gluconates and citrates; and halides, nitrates, sulfates and perchlorates. Examples are iron-III acetate, citrate, gluconate, nitrate, sulfate and perchlorate; iron-II or iron-III chloride and iron-II oxalate; ruthenium-III chloride; cobalt-II acetate, nitrate and sulfate; cobalt-II chloride and bromide; rhodium-II acetate and rhodium-III chloride; nickel-II acetate, nickel-II bromide and chloride and nickel-II sulfate; palladium-II chloride and iodide, and palladium acetate and nitrate; copper-II formate and acetate, copper-I or copper-II chloride, bromide and iodide and copper-II nitrate and sulfate; and silver acetate, chloride, bromide, nitrate and sulfate.

Preferably, the polymers according to the invention are at least partly complexed with non-noble metal ions, in particular iron, cobalt, nickel or copper ions. Cu$^{++}$ ions are particularly preferred.

Carboxylates, in particular acetates, where relevant as mixtures with halides, especially bromides or chlorides, are particularly suitable for the complexing. Copper-II acetate or mixtures of copper-II acetate and copper-II bromide, advantageously in a ratio of copper-II acetate to copper-II bromide of between 1:8 and 1:100, are particularly preferred for the complexing. The degree of complexing is preferably up to 15% of the complexable OH or secondary or tertiary amino groups.

Particularly preferred polymers according to the invention are, on the one hand, those having an intrinsic viscosity [η] of 0.30 to 0.50 dl/g, measured at 25° C. in DMF, and consisting of 2 to 10 mol % of recurring structural elements of the formula I and 90 to 98 mol % of recurring structural elements of the formula II, in which X is bonded in the 2-position on the anthraquinone radical, R is hydrogen or, in particular, methyl, R' and R" are each hydrogen and X is —COO—, —COO[(CH$_2$CH(CH$_3$)—O]$_n$— or —COO[(CH$_2$)$_n$—O]$_r$, where n is 1-11, —COOCH$_2$—, —COO[(CH$_2$)$_n$—O]$_r$CO— or —COO[(CH$_2$)$_n$—O]$_r$—CH$_2$—, where n is 2-8, or phenylene—CH$_2$—O—, and in particular —COO— or phenylene—CH$_2$—O—, and, in 55-65% of the structural elements of the formula II, Z is hydrogen or, in particular, methyl and Z$_1$ is —COO(CH$_2$)$_2$—N(CH$_3$)$_2$, or, in particular, —COO(CH$_2$)$_2$ OH and, in 35-45% of the structural elements of the formula II, Z is methyl or, in particular, hydrogen and Z$_1$ is phenyl or —COO—C$_{1-8}$-alkyl, in particular —COOmethyl, —COOethyl or —COO—2-ethylhexyl, the structural elements of the formula II being at least partly, preferably to the extent of 5 to 15%, complexed with iron, cobalt, nickel or copper ions, in particular Cu$^{++}$ ions. r is preferably 1.

Preferred non-complexed polymers according to the invention are those having an intrinsic viscosity of 0.30 to 0.50 dl/g and consisting of 3-40 mol % of recurring structural elements of the formula I and 60-97 mol % of recurring structural elements of the formula II, in which X is bonded in the 2-position on the anthraquinone radical, R is hydrogen or, in particular, methyl, R' and R" are each hydrogen and X is —COO—, —COO[CH$_2$CH(CH$_3$)—O]$_n$— or —COO[(CH$_2$)$_n$—O]$_r$—, where n is 1-11, —COO—CH$_2$—, —COO—[(CH$_2$)$_n$—O]$_r$—CO— or —COO[(CH$_2$)$_n$—O]$_r$—CH$_2$—, where n is 2-8, or phenylene—CH$_2$—O—, and r is 1-4, in particular 1, and, in 20-65% of the structural elements of the formula II, Z is hydrogen or, in particular, methyl and Z$_1$ is —COO(CH$_2$)$_2$N(CH$_3$)$_2$ or, in particular, —COO(CH$_2$)$_2$—OH and, in 35-80% of the structural elements of the formula II, Z is methyl or, in particular, hydrogen and Z$_1$ is phenyl or —COO—C$_{1-8}$-alkyl.

The polymers according to the invention can be prepared in a manner which is known per se, by polymerising 1 to 40 mol % of a compound of the formula Ia

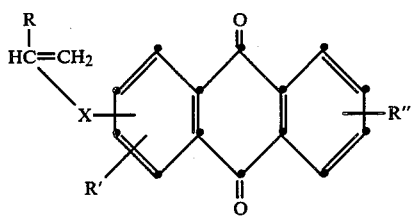
(Ia)

with 60 to 99 mol % of a compound of the formula IIa

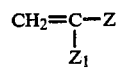
(IIa)

and, where relevant, then at least partly complexing the resulting polymer with a salt of a metal of group VIII or Ib of the periodic table. In the above formulae, m, n, r, R, R', R", X,Z and Z$_1$ and the proportion of —COO—C$_{2-12}$-alkylene—OH, —COO(CH$_2$CH$_2$O)$_p$H, —COO[CH$_2$CH(CH$_3$)O]$_p$ H, hydroxymethylphenyl, —CONH—C$_{1-4}$-alkylene—OH or —COO—C$_{1-4}$-alkylene—N—(Q')(Q") groups are as defined under formulae I and II. The structural elements of the formula II can be complexed before or, preferably, during application of the polymers according to the invention.

The polymerisation can be carried out by customary methods, for example in the presence of free radical or ionic initiators. Free radical polymerisation is preferred. Free radical initiators which are known per se, such as inorganic or organic peroxides or azo compounds, for example hydrogen peroxide, potassium peroxydisulfate, tert.-butyl hydroperoxide, di-tert.-butyl peroxide, peracetic acid, dibenzoyl peroxide, diacryl peroxide, cumene hydroperoxide, tert.-butyl perbenzoate, tert.-alkyl peroxycarbonate and α,α'-azoisobutyronitrile, in amounts of about 0.01 to 5% by weight, preferably 0.01 to 1.5% by weight, based on the total weight of monomers, are advantageously used for the polymerisation. The reaction temperatures for the free radical polymerisation are generally between about 30° and 100° C. However, the free radical polymerisation can also be carried out in the cold, for which redox systems, in the above concentrations, can also be used, for example mixtures of peroxides, such as hydrogen peroxide, and reducing agents, such as divalent iron ions. The polymerisation can be carried out in a homogeneous phase system, for example in bulk or in solution, or in a heterogeneous phase system, i.e. as precipitation, emulsion or suspension polymerisation. Solution polymerisation is preferred.

Examples of suitable solvents are cyclic ethers, such as tetrahydropyran, tetrahydrofuran and dioxane, aliphatic and cyclic amides, such as N,N-dimethylformamide, N,N-dimethylacetamide and N-methylpyrrolidone; and diacetone alcohol and chloroform.

Polymers according to the invention in which Z$_1$ is not —COOH, —CONH$_2$, —COO—C$_{1-12}$-alkyl, —COOphenyl or

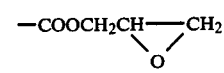

and X is not —COOCH$_2$CH(OH)CH$_2$OCO—, can also be obtained by incorporating the anthraquinone radical in already existing polymers having suitable functional groups. For this, in a manner which is known per se, polymers consisting of 1 to 40 mol % of recurring structural elements of the formula Ib

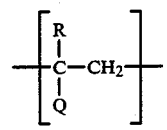
(Ib)

and 60 to 99 mol % of recurring structural elements of the formula IIb

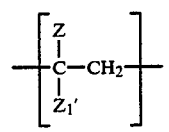
(IIb)

are reacted with a compound of the formula III

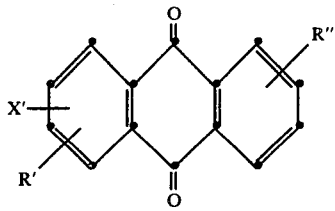  (III)

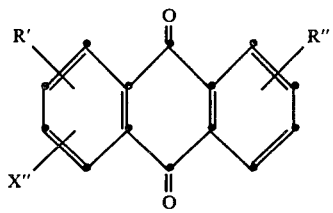  (IIIa)

and, where relevant, the resulting polymer is then at least partly complexed with a salt of a metal of group VIII or Ib of the periodic table. In the above formulae Ib, IIb and III, m, n, R, R', R" and Z and the proportion of —COO—$C_{2-12}$-alkylene—OH, —COO($CH_2CH_2O)_{\overline{p}}H$, —COO[$CH_2CH(CH_3)O]_{\overline{p}}H$, hydroxymethylphenyl, —CONH—$C_{1-4}$-alkylene—OH or —COO—$C_{1-4}$-alkylene—N—(Q')(Q") groups are as defined under formulae I and II, Q is —COhalogen, phenylene—$CH_2$-halogen or

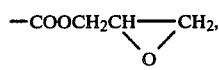

in which halogen is preferably chlorine, X' is HO—, HO—$(CH_2)_n$—, HO—[$(CH_2)_n$—O]$_r$—$CH_2$—, HO—[$CH_2CH(CH_3)$—O]—$CH_2$—, HO—[$(CH_2)_n$—O]$_r$—, HO[$CH_2CH(CH_3)$—O]$_n$—, HO—[$(CH_2)_n$—O]$_r$—CO—, HO—[$CH_2CH(CH_3)$—O]$_n$CO— or HNR— and Z'$_1$ has the same meaning as Z$_1$, with the exception of —COOH, —CONH$_2$, —COO—$C_{1-12}$-alkyl, —COOphenyl or

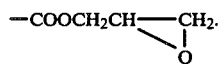

Finally, polymers in which Z is hydrogen or methyl and X is —COOCH$_2$CH(OH)CH$_2$—OCO—, —COO—[$(CH_2)_n$—O]$_r$—$CH_2$—, —COO—[$(CH_2)_n$—O]$_r$CO—, —COO—[$CH_2CH(CH_3)$—O]$_r$—$CH_2$—, —COO[$CH_2CH(CH_3)O]_n$—CO—, phenylene—$CH_2$—O[$(CH_2)_n$—O]$_r$—$CH_2$— or phenylene—$CH_2$—O—[$(CH_2)_n$—O]$_r$—CO— can also be prepared by reacting a polymer consisting of 1–40 mol % of recurring structural elements of the formula Ic

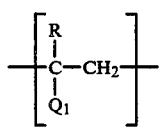  (Ic)

and 60–99 mol % of recurring structural elements of the formula IIc

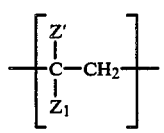  (IIc)

with 1–40 mol % of a compound of the formula IIIa and, where relevant, then at least partly complexing the resulting polymer with a salt of a metal of group VIII or Ib of the periodic table. In the above formulae Ic, IIc and IIIa, n, r, R, R', R" and Z and the proportion of —COO—$C_{2-12}$-alkylene—OH, —COO($CH_2CH_2O)_{\overline{p}}H$, —COO[$CH_2CH(CH_3)O]_{\overline{p}}H$, hydroxymethylphenyl, —CONH—$C_{1-4}$-alkylene—OH or —COO-$C_{1-4}$-alkylene—N(Q')(Q") groups are as defined under formulae I and II, Z' is hydrogen or methyl, Q$_1$ is

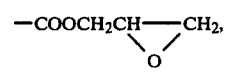

—COO—[$(CH_2)_n$—O]$_r$—H, —COO—[$CH_2CH(CH_3)$—O]$_n$—H, —COO[$CH_2CH(CH_3)$—O]$_r$—H or phenylene—$CH_2$—O—[$(CH_2)_n$—O]$_r$—H, and, if Q$_1$ is

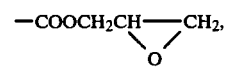

X" is COOH, or, if Q$_1$ is —COO[$(CH_2)_n$—O]$_r$—COO[$CH_2CH(CH_3)$—O]$_r$—H or phenylene—$CH_2$—O—[$(CH_2)_n$—O]$_r$—H, X" is —COOH, —COCl or —$CH_2Cl$, or, if Q$_1$ is —COO[$CH_2CH(CH_3)$—O]$_n$—H, X" is —COOH or —COCl.

The compounds of the formulae Ia, IIa, III and IIIa and the polymers of structural elements of the formulae Ib, Ic, IIb and IIc are known, or they can be prepared by methods which are known per se. Compounds of the formula Ia can be obtained by, for example, reacting anthraquinone derivatives of the formula III with monomers of the formula Id

  (Id)

in which R and Q are as defined above. The invention also relates to the novel monomers of the formula Ia in which R, R' and R" are as defined under formula I, X is —CO—O($CH_2)_n$—, —CO—O—[$(CH_2)_n$—O]$_r$—$CH_2$—, —CO—O—[$(CH_2)_n$—O]$_{\overline{n}}$, —CO—O—[$CH_2CH(CH_3)$—O]$_r$—$CH_2$—, —CO—O—[—$CH_2CH(CH_3)$—O]$_{\overline{n}}$, phenylene—$CH_2$—O—, —CO—O—[$(CH_2)_n$—O]$_r$—CO—, —CO—O—[$CH_2CH(CH_3)$—O]$_{\overline{n}}$CO—, —CO—NR—, phenylene—$CH_2$—O[$(CH_2)_n$—O]$_r$—($CH_2)_m$—, phenylene—$CH_2$—O—[$(CH_2)_n$—O]$_r$—CO— or —CO—O—$CH_2CH(OH)CH_2OCO$—, m is zero or 1, r is an integer from 1 to 4, n is an integer from 1 to 12 and n' is an integer from 2 to 12.

Preferred meanings of R, R', R" and X are as defined for formula I.

The photosensitive polymers according to the invention are used, for example, as sensitisers (redox catalysts) in various oxidation/reduction reactions, or as coating materials, for example for corrosion protection of photoelectric semiconductor diodes or semiconductor lasers. They are, however, particularly suitable for producing images by the action of light on various inorganic or organic substrates. Examples of suitable substrates for the production of images are glass, metals and metal oxides, such as aluminium, aluminium oxide and copper, and ceramics, paper and organic materials of high molecular weight. Suitable organic materials of high molecular weight include naturally occurring and synthetic polymers, for example cellulose materials, such as cellulose acetate, cellulose propionates, cellulose butyrates and cellulose ethers, such as methylcellulose; polymers which are derived from $\alpha,\beta$-unsaturated acids, such as polyacrylates and polymethacrylates, polyacrylamides and polyacrylonitrile; styrene polymers and copolymers thereof, for example styrene/butadiene copolymers and acrylonitrile/butadiene/styrene copolymers; vinyl and vinylidene polymers and copolymers thereof, such as polyvinyl chloride, polyvinylidene chloride, vinyl chloride/vinylidene chloride copolymers and vinyl chloride/vinyl acetate copolymers; polymers which are derived from unsaturated alcohols and amines, and derivatives of these polymers, such as polyvinyl alcohol, polyvinyl acetate and polyallylmelamine; crosslinked epoxide resins; polyacetals; polyalkylene oxides and polyphenylene oxides; polyamides, polyimides, polyamide/polyimide block copolymers, polysulfones and polyesters; and alkyd resins, for example glycerol/phthalic acid resins and mixtures thereof with melamine/formaldehyde resins, and melamine/formaldehyde, urea/formaldehyde and phenol/formaldehyde resins and the like.

The polymers according to the invention are used, in particular, for producing electrically conductive coatings or patterns, especially printed circuits. For this purpose, the metal ions of the at least partly complexed polymers according to the invention are reduced to zero-valent non-conductive metal nuclei (non-conductive visible image locations) in a manner which is known per se under the action of light, or, in the case of non-complexed polymers according to the invention, free radicals are produced, on which electrically conductive metallic coatings or patterns can be produced in the customary manner, by deposition of metals, such as copper, nickel, cobalt, silver, tin and the like, without a current. If desired, these metallic coatings or patterns can be intensified by electrolytic metal deposition baths. The polymers according to the invention can be exposed using any suitable light source, for example xenon lamps, metal halide lamps and, in particular, high-pressure and medium-pressure mercury lamps.

(A) PREPARATION OF COMPOUNDS OF THE FORMULA IA

EXAMPLE 1: Preparation of (2-anthraquinonyl)-4-oxa-3-oxo-2-methylbut-1-ene 0.2 mol of 2-hydroxyanthraquinone is dissolved in 600 ml of pyridine under an inert gas in a 1,000 ml brown glass flask with a dropping funnel and thermometer. 0.24 mol of methacryloyl chloride is then added dropwise in the course of 15 minutes, with ice-cooling. After the mixture has been stirred at room temperature for 20 hours, the pyridine is removed on a rotary evaporator. The crude crystalline product is suspended in 500 ml of 0.1 N HCl, the suspension is filtered, the solid is taken up in water again and, after washing with sodium bicarbonate solution and water, the crude product is dried in vacuo. Yield of crude product: 90% of theory. Recrystallisation of the crude product from ethylene glycol monomethyl ether gives a 58% yield of 2-anthraquinonyl methacrylate as a yellow crystalline product; melting point: 184–186° C. $\epsilon_{254}=50200$, $\epsilon_{325}=5200$ in ethanol.

Analysis: Calculated: C 72.97; H 4.14; O 21.90.
Found : C 72.85; H 4.16; O 22.12.

EXAMPLE 2: Preparation of (1-anthraquinonyl)-4-oxa-3-oxo-2-methylbut-1-ene (1-Anthraquinonyl)-4-oxa-3-oxo-2-methylbut-1-ene is prepared by the procedure described in Example 1, using 0.2 mols of 1-hydroxyanthraquinone. After recrystallisation, 54.7% of product of melting point 187–189° C. is obtained. $\epsilon_{252}=43000$, $\epsilon_{331}=5400$ in chloroform.

Analysis: Calculated: C 73.97; H 4.14; O 21.90.
Found: C 73.88; H 4.20; O 21.90.

EXAMPLE 3: Preparation of (2-anthraquinonyl)-5-oxa-4-oxo-3-methylpent-1-ene

The compound is prepared by the method of G. Izoret, Ann. Chim. 7, 180 (1962).

EXAMPLE 4: Preparation of m-/p-methylstyryl 1-anthraquinonyl ether 0.1 mol of 1-hydroxyanthraquinone is dissolved hot in 100 ml of N-methylpyrrolidone in a 1 liter brown glass flask with a mechanical stirrer, thermometer and condenser. After the mixture has been cooled to room temperature, 0.1 mol of NaH suspension is added in portions. When the evolution of gas has ended, 0.11 mol of a mixture of 3- and 4-vinylbenzyl chloride is added and the mixture is stirred at 100° C. for 5 hours. Stirring is continued overnight at room temperature. 100 ml of 0.1 N HCl are then added and the suspension thus formed is extracted several times by shaking with methylene chloride. After the extract has been neutralised with sodium bicarbonate solution and dried with $Na_2SO_4$ and the methylene chloride has been stripped off, an oil remains, from which a yellow crystalline product is precipitated with water. Crude yield: 33.7 g (99% of theory). The crude product is purified by column chromatography with methylene chloride; yield of m-/p-methylstyryl 1-anthraquinonyl ether=58% of theory, melting point: 88°–90° C.

Analysis: Calculated: C 81.16; H 4.74; O 14.10.
Found: C 81.10; H 4.96; O 14.12.

EXAMPLE 5: Preparation of m-/p-methylstyryl 2-anthraquinonyl ether m-/p-Methylstyryl-2-anthraquinonyl ether is prepared by the procedure described in Example 4, using 2-hydroxyanthraquinone instead of 1-hydroxyanthraquinone. Yield: 45% of theory, melting point: 97420–99° C. (uncorrected).

Analysis: Calculated: C 81.16; H 4.74; O 14.10.
Found: C 80.96; H 4.64; O 14.15.

EXAMPLE 6: Preparation of (2-anthraquinonyl)-7-oxa-4-oxa3-oxo-2-methylhept-1-ene 0.25 mol of 2-hydroxyanthraquinone is dissolved in 200 ml of N-methylpyrrolidone, and 0.25 mol of NaH is added in portions, under an inert gas. The temperature does not exceed 40° C. When the evolution of gas has ended, 0.375 mol of 2-chloroethanol is added and the reaction mixture is kept at 70° C. for 5 hours. When the batch has cooled to room temperature, it is poured into 2 liters of 0.01 N HCl. The product precipitated is filtered off, washed with sodium bicarbonate solution and dried. To prepare the methacrylate, the crude product thus obtained is reacted with methacryloyl chloride in pyridine as described in Example 1. After recrystallisation from ethylene glycol monomethyl ether, (2-anthraquinonyl)-7-oxa-4-oxa-3-oxo-2-methylhept-1-ene is obtained in a yield of 56.12% of theory; melting point: 122° C.

Analysis: Calculated: C 71.42; H 4.80; O 23.79.
Found: C 71.27; H 4.78; O 22.64.

EXAMPLE 7: Preparation of (2-anthraquinonyl)-11-oxa-4-oxa-3-oxo-2-methylundec-1-ene (2-Anthraquinonyl)-11-oxa-4-oxa-3-oxo-2-methylundec-1-ene is prepared by the procedure described in Example 6, using 6-chlorohexanol instead of 2-chloroethanol; yield: 54.81% of theory (after recrystallisation from methanol). Melting point: 79° C.

Analysis: Calculated: C 73.45; H 6.16; O 20.38.
Found: C 73.27; H 6.36; O 20.61.

EXAMPLE 8: Preparation of (2-anthraquinonyl)-8-oxo-7-oxa-4-oxa-3-oxo-2-methyloct-1-ene

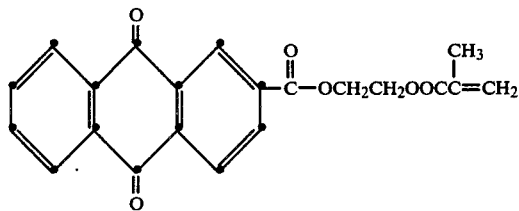

30 g (0.12 mol) of 2-anthraquinonecarboxylic acid are suspended in 100 ml of thionyl chloride at 0° C., with exclusion of moisture. After 2 ml of N,N-dimethylformamide (DMF) have been added, the mixture is heated slowly to the reflux temperature. A clear solution is formed. Excess thionyl chloride is removed by distillation in vacuo, and the residue is recrystallised from toluene. 27 g of 2-anthraquinonecarboxylic acid chloride are obtained. A mixture of 17 g (0.15 mol) of hydroxyethyl methacrylate, 30 ml (0.2 mol) of triethylamine and 50 ml of methylene chloride is added dropwise to a solution of 27 g (0.1 mol) of 2-anthraquinonecarboxylic acid chloride in 200 ml of methylene chloride such that the temperature of the reaction mixture does not exceed 10° C. Acidified ice-water is then added and the organic phase is washed several times with water and sodium bicarbonate solution and dried over sodium sulfate. After the methylene chloride has been stripped off and the residue has been recrystallised from ethanol, the hydroxyethyl methacrylate of 2-anthraquinonecarboxylic acid is obtained in a yield of 72% of theory, melting point: 119°–120° C.

Analysis: Calculated: C 69.23; H 4.43; O 26.35.
Found: C 69.4; H 4.5; O 26.6.

EXAMPLE 9: Preparation of (2-anthraquinonyl)-9-oxo-8-oxa-4-oxa-3-oxo-2-methylnon-1-ene The hydroxypropyl methacrylate of 2-anthraquinonecarboxylic acid is prepared by the process described in Example 8, using hydroxypropyl methacrylate instead of hydroxyethyl methacrylate; yield: 76% of theory, melting point: 88°–92° C.

Analysis: Calculated: C 69.84; H 4.80; O 25.37.
Found: C 69.65; H 4.87; O 0 25.40.

EXAMPLE 10: Preparation of (2-anthraquinonyl)-16-oxa-4-oxa-3-oxo-2-methylhexadec-1-ene 0.25 mol of 2-hydroxyanthraquinone and 0.4 mol of 11-bromoundecan-1-ol are reacted to give (2-anthraquinonyl)-12-oxa-dodecan-1-ol by the process described in Example 6. Recrystallisation from methanol gives 79.1 g (80% of theory) of product; $\epsilon_{max}$ 34600 (270 nm), 3600 (330 nm), 3200 (370 nm).

Analysis: Calculated: C 76.11; H 7.66; O 16.22.
Found: C 75.44; H 7.64; O 16.06.

39.45 g (0.1 mol) of (2-anthraquinonyl)-12-oxo-dodecan-1-ol are dissolved in 300 ml of tetrahydrofuran with 0.15 mol of triethylamine, with stirring and under an inert gas. 0.11 mol of methacryloyl chloride in 20 ml of tetrahydrofuran is added dropwise at 10° C. After the mixture has been stirred for 3 hours, the solvent is stripped off, the residue is taken up in methylene chloride and the mixture is extracted with aqueous citric acid. After the organic phases have been dried and concentrated, 36.7 g (79.34% of theory) of (2-anthraquinonyl)-16-oxa-4-oxa-3-oxo-2-methylhexadec-1-ene remain. Melting point: 66° C. (uncorrected).

Analysis: Calculated: C 75.30; H 7.41; O 17.29.
Found: C 75.20; H 7.66; O 17.10.

EXAMPLE 11: Preparation of (2-anthraquinonyl)-7-oxa-4-oxa-3-oxo-2-methyloct-1-ene 10 g (0.039 mol) of 2-chloromethylanthraquinone (prepared in accordance with the instructions of G. Izoret, Ann. Chim. 7, 151 (1962)) in 200 ml of ethylene glycol are refluxed for 3 hours, with stirring and with exclusion of moisture. The product which has crystallised out on cooling is washed with water and recrystallised from ethanol. 8.9 g (80.92% of theory) of 2-(2-hydroxyethoxymethyl)-anthraquinone are obtained. 8 g (0.03 mol) of 2-(2-hydroxyethoxymethyl)-anthraquinone are dissolved in 180 ml of tetrahydrofuran, 4.34 ml (0.05 mol) of triethylamine are added and the mixture is cooled to 5° C. 3 ml (0.03 mol) of methacryloyl chloride in 10 ml of tetrahydrofuran are then added dropwise, with stirring and under an inert gas, such that the temperature does not exceed 5° C. When the dropwise addition has ended, stirring is continued at room temperature for 5 hours. The solvent is then stripped off on a rotary evaporator and the solid product is washed several times with 1% citric acid and water and dried in vacuo. 7.76 g of (2-anthraquinonyl)-7-oxa-4-oxa-3-oxo-2-methyloct-1-ene are obtained, and 7.48 g (71.17% of theory) after recrystallisation from ethanol.

Analysis: Calculated: C 71.99; H 5.18; O 22.83.
Found: C 72.25; H 5.04; O 22.58.
Melting point: 90° C. (uncorrected).

(B) PREPARATION OF THE POLYMERS

EXAMPLES 12–22

0.5% by weight of azoisobutyronitrile is added to in each case 600 ml of a 20% (by weight) solution of the monomers listed in Tables I and II below in dioxane, with exclusion of light, under an inert gas and with stirring at 70° C. After 18 hours at 70° C., the polymers are isolated by precipitation in diethyl ether.

late (mixture of 2- and 3-hydroxypropyl methacrylate) and 0.745 mol of methyl methacrylate by the process described in Example 12. The amounts of anthraqui-

TABLE I

| Example No. | Anthraquinone derivative according to Example No. | 2-Hydroxyethyl methacrylate content of the copolymer in mol % | Intrinsic viscosity [η] in dl/g, measured at 25° C. in DMF | Glass transition temperature Tg °C. |
|---|---|---|---|---|
| 12 | 1 | 99 | 0.23 | 80 |
| 13 | 1 | 95 | 0.21 | 84 |
| 14 | 1 | 85 | 0.11 | 65 |

TABLE II

| Example No. | Anthraquinone derivative according to Example No. | 2-Hydroxyethyl methacrylate content of the copolymer in mol % | 2-Ethylhexyl acrylate content of the copolymer in mol % | Intrinsic viscosity [η] in dl/g at 25° C. in DMF | Glass transition temperature Tg °C. |
|---|---|---|---|---|---|
| 15 | 1 | 65 | 31.5 | 0.25 | 38 |
| 16 | 3 | 65 | 31.5 | 0.30 | 44 |
| 17 | 6 | 65 | 31.5 | 0.469 | 40 |
| 18 | 6 | 50 | 35 | 0.25 | 59 |
| 19 | 7 | 65 | 31.5 | 0.476 | 34 |
| 20 | 5 | 65 | 28 | 0.277 | 38 |
| 21 | 4 | 65 | 28 | 0.314 | 44 |
| 22 | 9 | 65 | 31.5 | 0.42 | 52 |

EXAMPLE 23

A terpolymer of 3.5 mol % of the anthraquinone derivative according to Example 1, 65 mol % of 2-hydroxyethyl methacrylate and 31.5 mol % of vinylbenzene is prepared by the procedure described in Example 12. Tg of the polymer = 82° C.; [η] = 0.33 dl/g in DMF at 25° C.

EXAMPLE 24

A terpolymer of 1.5 mol % of the anthraquinone derivative according to Example 7, 75.5 mol % of 2-hydroxyethyl methacrylate and 23 mol % of methyl methacrylate is prepared by the procedure described in Example 12. Tg of the polymer = 40° C.; [η] = 0.24 dl/g in DMF at 25° C.

EXAMPLE 25

A terpolymer of 7 mol % of the anthraquinone derivative according to Example 7, 60 mol % of N,N-dimethylaminoethyl methacrylate and 33 mol % of 2-ethylhexyl acrylate is prepared by the procedure described in Example 12. Tg of the polymer = 51° C.; [η] = 0.42 dl/g in DMF at 25° C.

EXAMPLE 26

A mixture of m- and p-vinylbenzyl alcohol is prepared in accordance with the instructions of C. H. Bamford and H. Lindsay [Polymer 14, 330 (1973)]. To prepare a photosensitive polymer, 0.257 g of azoisobutyronitrile is added to 8.75 g (26 mmols) of m-/p-methylstyryl 2-anthraquinonyl ether, 32.02 g (239 mmols) of m-/p-vinylbenzyl alcohol and 10.71 g (103 mmols) of ethenylbenzene in 450 ml of dioxane at 70° C., with stirring and under an inert gas, and the mixture is stirred for 12 hours. The polymer is isolated by precipitation in water. Yield: 17.14 g.

EXAMPLES 27–30

100.15 g of a copolymer having a Tg of 1° C. and an intrinsic viscosity [η] of 0.642 dl/g in DMF at 25° C. is obtained from 1.383 mols of hydroxypropyl methacrynone-2-carboxylic acid chloride given in Table III which follows are in each case added to 10% solutions of this copolymer in pyridine, with exclusion of moisture, and the mixture is stirred at 50° C. for 12 hours. The polymer is isolated by precipitation in diethyl ether. The results are summarised in Table III.

TABLE III

| Example No. | g of polymer | g of anthraquinone-2-carboxylic acid chloride | Anthraquinone content[1] $\eta_{max} = 325$ nm | Mol % of structural elements (I) | Tg °C. of the polymer |
|---|---|---|---|---|---|
| 27 | 25 | 1.8 | 6.55% by wt. | 3.4% | 89 |
| 28 | 11.51 | 3.25 | 27.61% by wt. | 17% | 86 |
| 29 | 11.51 | 4.06 | 33.60% by wt. | 27% | 89 |
| 30 | 11.51 | 5.41 | 41.86% by wt. | 35% | 92 |

[1]calculated from the extinction at $\eta_{325}$ nm.

(C) USE EXAMPLES

EXAMPLE 31: Production of images with complexed polymers

An amount of copper acetate or of a mixture of copper acetate and copper-II bromide equimolar to the anthraquinone content is dissolved in a 30% (by weight) solution, in DMF, of the polymers given in Table IV. The resulting copper/polymer complex solution is filtered through a 0.5 μm filter by means of a pressure suction filter. Films with a wet-film thickness of between 12 and 50 μm are drawn, using a roller-coater, on polyester film 125 μm thick (Mylar-A ® from DuPont). After the films have been exposed to air and dried at 70° C. in a circulating air oven, they are exposed, on a temperature-controllable vacuum frame, through a photomask (Stouffer 21-step sensitivity guide step wedge) using a 5 kw mercury light source (W. Staub AG, Neu-Isenburg, Federal Republic of Germany). A visible non-conductive image results, which is intensified to a metallic, electrically conductive copper image at 49° C. in a copper deposition bath having the following composition:

| | |
|---|---|
| Copper sulfate | 12 g/l |
| Formaldehyde | 8 g/l |
| NaOH | 15 g/l |
| Sodium/potassium tartrate | 14 g/l |
| Ethylenediaminetetraacetic acid | 20 g/l |
| Octylphenol polyethylene glycol ether n~1 (Tryton X 100 ® from Rohm + Haas) | 1 g/l |

The results and conditions are given in the following Table IV.

TABLE IV

| Polymer according to Example No. | Wet film thickness in μm | Molar ratio of CuBr$_2$ : Cu(C$_2$H$_5$O$_2$)$_2$·H$_2$O | Exposure temperature °C. | last step at which an image is formed after 90" |
|---|---|---|---|---|
| 13 | 24 | 0.11 | 90 | 4 |
| 14 | 50 | 0 | 90 | 2 |
| 23 | 50 | 0 | 90 | 3 |
| 15 | 50 | 0.20 | 90 | 4 |
| 16 | 24 | 0 | 60 | 2 |
| 17 | 50 | 0 | 90 | 3 |
| 18 | 50 | 0.11 | 80 | 2 |
| 19 | 24 | 0 | 60 | 5 |
| 24 | 24 | 0.11 | 75 | 4 |
| 21 | 50 | 0.11 | 90 | 4 |
| 20 | 12 | 0.11 | 90 | 5 |
| 25 | 24 | 0.11 | 70 | 2 |
| 22 | 24 | 0.11 | 70 | 3 |
| 26 | 24 | 0 | 90 | 2 |
| 27 | 24 | 0 | 90 | 3 |
| 28 | 24 | 0 | 90 | 5 |

EXAMPLE 32: Production of images with non-complexed polymers

To test non-complexed polymers according to the invention for so-called physical development, polyester films (Mylar-A ® from DuPont) are coated with the polymers given in Table V which follows, exposed and then treated with the copper deposition bath, as described in Example 31.

The results and conditions are given in Table V.

TABLE V

| Polymer according to Example No. | Wet film thickness μm | Exposure temperature °C. | Last step at which an image is formed after 90" |
|---|---|---|---|
| 22 | 12 | 50 | 8 |
| 18 | 12 | 40 | 5 |
| 28 | 24 | 30 | 8 |
| 29 | 24 | 30 | 10 |
| 30 | 24 | 30 | 6 |

What is claimed is:

1. A polymer having an intrinsic viscosity [η] of not less than 0.10 dl/g, measured at 25° C. in N,N-dimethylformamide, which consists of 1 to 40 mol % of recurring structural elements of the formula I

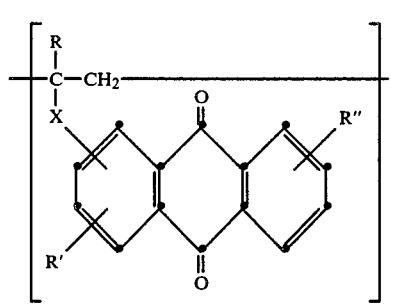

and 60 to 99 mol % of recurring structural elements of the formula II

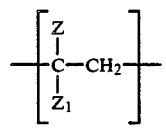

wherein not less than 40% of the structural elements of formula II

Z$_1$ is —COO—alkylene—OH having 2–12 C atoms in the alkylene moiety, —COO(CH$_2$CH$_2$O)p—H or —COO[CH$_2$CH(CH$_3$)O]p—H, where p is 2–4, hydroxymethylphenyl or —CONH—C$_{1-4}$-alkylene—OH;

in which R is hydrogen, methyl or ethyl, R' and R" independently of one another are hydrogen, C$_1$–C$_4$-alkyl, halogen, nitro or methoxy, X is —COO—, —CO—O—(CH$_2$)$_n$—, —CO—O—[(CH$_2$)$_n$—O]$_r$—CH$_2$—, —CO—O—[(CH$_2$)$_n$—O]$_r$—, —CO—O—[CH$_2$CH(CH$_3$)O]$_n$—, phenylene—CH$_2$—O—, —CO—O—[(CH$_2$)$_n$—O]$_r$—CO—, —CO—O—[CH$_2$CH(CH$_3$)—O]$_n$CO—, —CO—NR—, phenylene—CH$_2$—O—[(CH$_2$)$_n$—O]$_r$—(CH$_2$)$_m$—, phenylene—CH$_2$—O—[CH$_2$)$_n$—O]$_r$—CO , —COOCH$_2$CH(OH)CH$_2$OCO—, —COOCH$_2$CH(OH)CH$_2$O— or —CO—O—[CH$_2$CH(CH$_3$)O$_r$CH$_2$—, m is zero or 1, n is an integer from 1 to 12, r is an integer from 1 to 4, Z is hydrogen, chlorine or methyl;

and where in the remaining structural elements of formula II Z$_1$ is hydrogen, chlorine, methyl, —CN, —COOH, —CONH$_2$, phenyl, methylphenyl, methoxyphenyl, cyclohexenyl, imidazolyl, pyrrolidonyl, —COO-alkyl having 1–12 C atoms in the alkyl moiety, —COOphenyl,

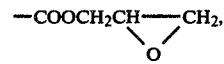

—OCOalkyl having 1–4 C atoms in the alkyl moiety, —OCOphenyl, —COalkyl having 1–4 C atoms in the alkyl moiety, C$_1$–C$_{12}$-alkoxy or phenoxy, and the structural elements of the formula II are uncomplexed or are at least partly complexed with metal ions of a metal of group VIII or Ib of the periodic table, with the proviso that, if X is —CO—O—CH$_2$—, Z$_1$ is —COOCH$_2$CH$_2$OH in not more than 80% of the structural elements of the formula II.

2. A polymer according to claim 1, which consists of 1 to 15 mol % of recurring structural elements of the formula I and 85 to 99 mol % of recurring structural elements of the formula II, in which R, R', R", m, n, r and Z are as defined in claim 1, $Z_1$ is as defined in claim 1, but is not —COO(CH$_2$CH$_2$O)$_p$-H or —COO[CH$_2$CH(CH$_3$)O]$_p$—H, and X is as defined in claim 1, but is not —COOCH$_2$CH(OH)CH$_2$O—, —COOCH$_2$CH(OH)CH$_2$OCO— or —COO[CH$_2$CH(CH$_3$)O]$_r$-CH$_2$—, and $Z_1$ is —COO—C$_{2-12}$-alkylene—OH, hydroxymethylphenyl or —CONH—C$_{1-4}$-alkylene—OH in not less than 40% of the structural elements of the formula II.

3. A polymer according to claim 1, wherein the structural elements of the formula II are at least partly complexed with iron, cobalt, nickel or copper ions.

4. A polymer according to claim 1, wherein the structural elements of the formula II are at least partly complexed with Cu$^{++}$ ions.

5. A polymer according to claim 1, wherein X is bonded in the 2-position on the anthraquinone radical, R is hydrogen or methyl, R' and R" are each hydrogen, X is —COO—, —COO[CH$_2$CH(CH$_3$)—O]$_n$— or —COO—[(CH$_2$)$_n$—O]$_r$—, where n is 1-11, —COO—CH$_2$—, —COO—[(CH$_2$)$_n$—O]$_r$CO— or —COO[CH$_2$)$_n$—O]$_r$—CH$_2$—, where n is 2-8, or phenylene—CH$_2$—O—.

6. A polymer according to claim 1, wherein, in 20 to 97.5% of the structural elements of the formula II, $Z_1$ is —COO—C$_{2-12}$—alkylene—OH, hydroxymethylphenyl, —CONH—C$_{1-4}$-alkylene—OH, —COO(CH$_2$C-H$_2$O)$_p$H or —COO[CH$_2$CH(CH$_3$)O]$_p$H.

7. A polymer according to claim 1, wherein Z is hydrogen, chlorine or methyl and $Z_1$ is hydrogen, chlorine, —CN, methyl, phenyl, methylphenyl, methoxyphenyl, —COO—C$_{1-10}$-alkyl, —COO—phenyl,

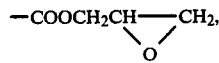

—COO—C$_{2-12}$-alkylene—OH, —CO—alkyl having 1-4 C atoms, alkoxy having 1-8 C atoms, phenoxy hydroxymethylphenyl, or —CONH(CH$_2$)$_2$—OH, the proportion of —COO—C$_{2-12}$-alkylene—OH, hydroxymethylphenyl or —CONH(CH$_2$)$_2$—OH groups $Z_1$ being 20 to 70%.

8. A polymer according to claim 1, wherein Z is hydrogen or methyl and $Z_1$ is methyl, phenyl, methylphenyl, —COO—C$_{1-10}$-alkyl, —COO—C$_{2-12}$-alkylene-OH or hydroxymethylphenyl, the proportion of —COO-C$_{2-12}$-alkylene-OH or hydroxymethylphenyl groups being 20 to 70%.

9. A polymer according to claim 1 having an intrinsic viscosity [$\eta$] of 0.30 to 0.50 dl/g, measured at 25° C. in N,N-dimethylformamide, and consisting of 2 to 10 mol % of recurring structural elements of the formula I and 90 to 98 mol % of recurring structural elements of the formula II, in which X is bonded in the 2-position on the anthraquinone radical R is hydrogen or methyl, R' and R" are each hydrogen and X is —COO—, —COO[CH$_2$CH(CH$_3$)—O]$_n$ or —COO[(CH$_2$)$_n$—O]$_r$—, wherein n is 1-11, —COO—CH$_2$, —COO—[(CH$_2$-)$_n$—O ,CO— or —COO[(CH$_2$)$_n$—O]$_r$—CH$_2$— where n is 2-8, phenylene—CH$_2$-O—, —COO— or phenylene—CH$_2$—O—, and r is 1-4, and in 55-65% of the structural elements of the formula II, Z is hydrogen or methyl and $Z_1$ is —COO(CH$_2$)$_2$ OH and, in 35-45% of the structural elements of the formula II, Z is methyl or hydrogen and $Z_1$ is phenyl or —COO—C$_{1-8}$-alkyl, the structural elements of the formula II being at least partly complexed with iron, cobalt, nickel or copper ions.

10. A non-complexed polymer according to claim 1 having an intrinsic viscosity [$\eta$] of 0.30 to 0.50 dl/g, measured at 25° C. in N,N-dimethylformamide, and consisting of 3 to 40 mol % of recurring structural elements of the formula I and 60 to 97 mol % of recurring structural elements of the formula II, in which X is bonded in the 2-position on the anthraquinone radical, R is hydrogen or methyl, R' and R" are each hydrogen and X is —COO—, —COO[CH$_2$CH(CH$_3$)—O]$_n$— or —COO[(CH$_2$)$_n$—O]$_r$—, where n is 1-11, —COO-CH$_2$—, —COO-[(CH$_2$)$_n$-O]$_r$-CO— or —COO[(CH$_2$)$_n$-O]$_r$-CH$_2$—, where n is 2-8, or phenylene-CH$_2$-O—, and r is 1-4, and in 20-65% of the structural elements of the formula II, Z is hydrogen or methyl and $Z_1$ is —COO(CH$_2$)$_2$—OH and, in 35-80% of the structural elements of the formula II, Z is methyl or hydrogen and $Z_1$ is phenyl or —COO—C$_{1-8}$-alkyl.

11. A polymer according to claim 1, which consists of recurring structural elements of the formula

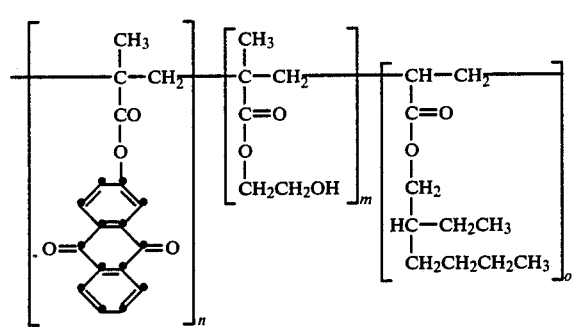

in which $\frac{n}{n+m+o} = 0.035$, $\frac{m}{n+m+o} = 0.65$ and $\frac{o}{n+m+o} = 0.315$.

12. A polymer according to claim 1, which consists of recurring structural elements of the formula

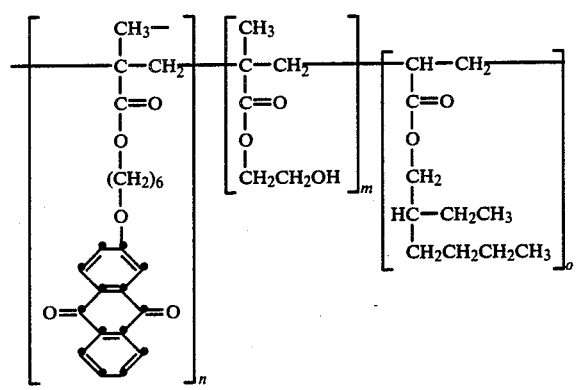

in which $\frac{n}{n+m+o} = 0.035$, $\frac{m}{n+m+o} = 0.65$ and $\frac{o}{n+m+o} = 0.315$.

* * * * *